(12) United States Patent
Gil

(10) Patent No.: US 11,635,466 B2
(45) Date of Patent: Apr. 25, 2023

(54) SYSTEM AND METHOD FOR DIAGNOSING RELAY FAULT

(71) Applicant: LG Chem, Ltd., Seoul (KR)

(72) Inventor: You Seob Gil, Daejeon (KR)

(73) Assignee: LG Energy Solution, Ltd.

(*) Notice: Subject to any disclaimer, the term of this patent is extended or adjusted under 35 U.S.C. 154(b) by 424 days.

(21) Appl. No.: 16/631,626

(22) PCT Filed: Nov. 20, 2018

(86) PCT No.: PCT/KR2018/014252
§ 371 (c)(1),
(2) Date: Jan. 16, 2020

(87) PCT Pub. No.: WO2019/117490
PCT Pub. Date: Jun. 20, 2019

(65) Prior Publication Data
US 2020/0174077 A1    Jun. 4, 2020

(30) Foreign Application Priority Data
Dec. 14, 2017   (KR) ........................ 10-2017-0172280

(51) Int. Cl.
*G01R 31/327* (2006.01)
*G01R 19/165* (2006.01)
*H05K 1/18* (2006.01)

(52) U.S. Cl.
CPC ....... *G01R 31/3278* (2013.01); *G01R 19/165* (2013.01); *H05K 1/181* (2013.01);
(Continued)

(58) Field of Classification Search
CPC .. G01R 31/3278; G01R 19/165; G01R 1/203; G01R 1/206; G01R 19/16571;
(Continued)

(56) References Cited

U.S. PATENT DOCUMENTS 7,605,568 B2   10/2009   Gangstoe et al.
9,069,044 B2    6/2015   Tae
(Continued)

FOREIGN PATENT DOCUMENTS

CN   1965243 A    5/2007
CN   104842801 A  8/2015
(Continued)

OTHER PUBLICATIONS

International Search Report for Application No. PCT/KR2018/014252, dated Mar. 4, 2019, pp. 1-3.
(Continued)

*Primary Examiner* — Yoshihisa Ishizuka
*Assistant Examiner* — Christopher J Gassen
(74) *Attorney, Agent, or Firm* — Lerner David LLP

(57) ABSTRACT

A relay abnormality diagnosis system and method capable of diagnosing an abnormality of a relay by directly connecting a diagnosis resistor to a current measurement unit and by using a current input to the current measurement unit from the diagnosis resistor and a current flowing on an electric circuit measured by the current measurement unit, in the relay abnormality diagnosis system that diagnoses the abnormality of the relay using the diagnosis resistor.

14 Claims, 3 Drawing Sheets

(52) U.S. Cl.
CPC .............. *H05K 2201/10022* (2013.01); *H05K 2201/10151* (2013.01)

(58) Field of Classification Search
CPC ................ G01R 31/006; H05K 1/181; H05K 2201/10022; H05K 2201/10151
See application file for complete search history.

(56) References Cited

U.S. PATENT DOCUMENTS

| | | | |
|---|---|---|---|
| 9,866,011 B2 | 1/2018 | Lee | |
| 9,970,988 B2 | 5/2018 | Lung et al. | |
| 2005/0270720 A1 | 12/2005 | Johnson | |
| 2011/0228438 A1* | 9/2011 | Kohri | H01H 1/0015 |
| | | | 361/187 |
| 2015/0236501 A1* | 8/2015 | Lee | H02H 7/18 |
| | | | 361/57 |
| 2016/0358732 A1* | 12/2016 | Nishio | G01R 31/3278 |
| 2017/0047734 A1* | 2/2017 | Jankowski | H01F 27/343 |
| 2017/0168115 A1* | 6/2017 | Lung | H03H 7/0115 |
| 2017/0288428 A1* | 10/2017 | Ishikawa | H02J 7/0026 |
| 2018/0006340 A1* | 1/2018 | Yamamoto | H01M 10/482 |
| 2018/0188326 A1 | 7/2018 | Huh et al. | |

FOREIGN PATENT DOCUMENTS

| | | | | |
|---|---|---|---|---|
| CN | 105929325 A | | 9/2016 | |
| CN | 107112744 A | * | 8/2017 | ........... G01R 19/165 |
| CN | 206505162 U | | 9/2017 | |
| JP | 2011215131 A | | 10/2011 | |
| JP | 2012-100438 A | | 5/2012 | |
| JP | 5652562 B1 | * | 1/2015 | ........... G01R 31/025 |
| JP | 2016225132 A | * | 12/2016 | |
| JP | 2016225132 A | | 12/2016 | |
| JP | 6153663 B1 | | 6/2017 | |
| JP | 2017118651 A | * | 6/2017 | |
| JP | 2017163776 A | * | 9/2017 | |
| KR | 101318021 B1 | | 10/2013 | |
| KR | 20130111048 A | | 10/2013 | |
| KR | 101448935 B1 | | 10/2014 | |
| KR | 101535011 B1 | | 7/2015 | |
| KR | 20150074653 A | | 7/2015 | |
| KR | 20150096230 A | | 8/2015 | |
| KR | 20160097860 A | | 8/2016 | |
| KR | 20170098049 A | | 8/2017 | |
| WO | 2017142385 A1 | | 8/2017 | |

OTHER PUBLICATIONS

European Search Report for EP18888840.8 dated Oct. 19, 2020; 2 pages.

Chinese Search Report for Application No. 201880045688.1 dated Jul. 6, 2021, 2 pgs.

Sugimoto T et al: "New maintenance method of circuit breaker driving by DC solenoid making use of the closing current waveform measurement" IEEE/PES Transmission and Distribution Conference and Exhibition, Yokohama, Japan, Oct. 2002, pp. 788-791 vol. 2.

* cited by examiner

SYSTEM AND METHOD FOR DIAGNOSING RELAY FAULT

CROSS-REFERENCE TO RELATED APPLICATION

The present application is a national phase entry under 35 U.S.C. § 371 of International Application No. PCT/KR2018/014252 filed Nov. 20, 2018, published in Korean, which claims priority from Korean Patent Application No. 10-2017-0172280 filed Dec. 14, 2017, all of which are incorporated herein by reference.

TECHNICAL FIELD

The present invention relates to relay abnormality diagnosis system and method, and more particularly, to relay abnormality diagnosis system and method capable of diagnosing an abnormality of a relay by directly connecting a diagnosis resistor to a current measurement unit and by using a current input to the current measurement unit from the diagnosis resistor and a current flowing on an electric circuit measured by the current measurement unit, in the relay abnormality diagnosis system that diagnoses the abnormality of the relay using the diagnosis resistor.

BACKGROUND ART

A relay is a switching device that operates when an input reaches a certain value to open or close another circuit. The relay has advantages that the relay may be interlocked with an independent circuit and turn on or off a large current circuit by an operation of a circuit configured of a low voltage system such as 5 V. In addition, since a coil portion and a contact portion in the relay are insulated and separated, there is an advantage that the relay may be electrically insulated from an external device. Because of such advantages, the relay is being utilized as a switching device in various fields where on/off switching is required.

In general, when an abnormal current flows on an electric circuit, the relay performs an on/off operation based on a control signal, thereby preventing a load from being damaged from the abnormal current.

However, when the relay is not able to be operated due to occurrence of an abnormality such as a welding of the relay, in a case where an abnormal current such as a high current flows on the electric circuit, the abnormal current may not be blocked and thus the load may be greatly damaged.

In order to solve this problem, in the related art, it has been prevented in advance that such a problem occurs by monitoring and diagnosing whether an abnormality occurs in a relay using a relay abnormality diagnosis system.

On the other hand, the relay abnormality diagnosis system in the related art uses a method in which a resistor and a switch are connected in series between a load terminal (DC link) and a negative terminal of a power source such as a battery, and at a time of a relay diagnosis, a current flowing on the resistor is measured after a conduction state of the switch is changed to an ON state.

However, when using such a relay abnormality diagnosis system of the related art, since a wire (DC link wire) for connecting the relay abnormality diagnosis system and a relay side, a wire (PACK minus wire) for connection to a negative terminal side of the battery, a MOSFET switch and a large number of resistors are required, there are problems that a volume of the system increases and a cost increases.

Therefore, the present inventor has developed relay abnormality diagnosis system and method capable of reducing a use of a large number of resistors and wires, by directly connecting a diagnosis resistor to a current measurement unit and by using a current input to the current measurement unit from the diagnosis resistor and a current flowing on an electric circuit measured by the current measurement unit, to diagnose an abnormality of a relay, in the relay abnormality diagnosis system that diagnoses the abnormality of the relay using the diagnosis resistor.

DETAILED DESCRIPTION OF THE INVENTION

Technical Problem

The present invention has been made to solve the above-described problems, and the present invention provides relay abnormality diagnosis system and method capable of reducing a use of a large number of resistors and wires, by directly connecting a diagnosis resistor that is positioned on one printed circuit board (PCB) to a current measurement unit through a circuit pattern and diagnosing an abnormality of a relay unit based on a current input to the current measurement unit from the diagnosis resistor unit and a current flowing on an electric circuit measured by the current measurement unit, in the relay abnormality diagnosis system that diagnoses the abnormality of the relay using the diagnosis resistor.

Technical Solution

A relay abnormality diagnosis system according to an embodiment of the present invention may include a relay positioned on an electric circuit, a current measurement circuit configured to measure a current flowing on the electric circuit, a diagnosis resistor configured to switchably connect or disconnect the relay unit and the current measurement unit, and a control circuit configured to control a connection between the relay and the current measurement circuit via the diagnosis resistor, and diagnose an abnormality of the relay based on a current input to the current measurement circuit from the diagnosis resistor unit and a measured current flowing on the electric circuit.

In an embodiment, the diagnosis resistor may include one or more resistors, and is coupled to a switch configured to change a conduction state between the relay and the current measurement circuit.

In an embodiment, to diagnose the abnormality of the relay unit, the control circuit may be configured to output a control signal for controlling the conduction state of the switch.

In an embodiment, the current measurement unit may be configured to measure the current flowing on the electric circuit by using a shunt resistor positioned on the electric circuit.

In an embodiment, the relay may be positioned between a positive terminal of a battery that is positioned on the electric circuit and a load, and the shunt resistor may be positioned between a negative terminal of the battery and the load.

In an embodiment, to diagnose the abnormality of the relay unit, the control unit may be configured to calculate a difference value between the measured current flowing on the electric circuit and the current input to the current measurement circuit from the diagnosis resistor unit, and may be configured to diagnose the abnormality of the relay unit based on the calculated difference value.

In an embodiment, the current measurement unit, the diagnosis resistor circuit, and the control circuit may be positioned on a printed circuit board (PCB), and may be interconnected through a circuit pattern.

A relay abnormality diagnosis method according to an embodiment of the present invention may include measuring, by a current measurement circuit, a current flowing on an electric circuit, switchably controlling, by a control circuit, a connection between a relay positioned on the electric circuit and the current measurement unit, via a diagnosis resistor, and diagnosing, by the control circuit, an abnormality of the relay based on a current input to the current measurement circuit from the diagnosis resistor and a measured current flowing on the electric circuit.

In an embodiment, the diagnosis resistor may include one or more resistors, and is coupled to a switch configured to change a conduction state between the relay and the current measurement circuit, and switchably controlling the connection between the relay and the current measurement circuit may include controlling the switch.

In an embodiment, diagnosing the abnormality of the relay may include outputting, by the control circuit, a control signal for controlling the conduction state of the switch.

In an embodiment, measuring the current may include measuring the current flowing on the electric circuit using a shunt resistor positioned on the electric circuit.

In an embodiment, switchably controlling the connection between the relay and the current measurement unit may be performed on a relay that may be positioned between a positive terminal of a battery that is positioned on the electric circuit and a load, and measuring the current flowing on the electric circuit may be performed using a shunt resistor that may be positioned between a negative terminal of the battery and the load.

In an embodiment, diagnosing the abnormality of the relay may include calculating a difference value between the measured current flowing on the electric circuit and the current input to the current measurement circuit from the diagnosis resistor unit and diagnosing the abnormality of the relay unit based on the calculated difference value.

In an embodiment, the current measurement circuit, the diagnosis resistor, and the control circuit may be positioned on one printed circuit board (PCB), and may be interconnected through a circuit pattern.

Advantageous Effects

The present invention directly connects a diagnosis resistor unit and a current measurement unit with each other and diagnoses an abnormality of a relay based on a current input to the current measurement unit from the diagnosis resistor unit and a current flowing on an electric circuit measured by the current measurement unit. Therefore, there is an advantage that it is possible to prevent occurrence of a secondary accident due to overvoltage or overcurrent by quickly determining whether or not the relay is faulty.

In addition, the present invention directly connects the diagnosis resistor unit and the current measurement unit that are positioned on one printed circuit board (PCB) with each other through a circuit pattern. Therefore, there is an advantage that it is not necessary to connect the diagnosis resistor unit and a negative terminal of a battery with each other by using a wire, thereby reducing volume and cost of a system.

In addition, in the present invention, since the current flowing through the diagnosis resistor unit is directly input to the current measurement unit, it is not necessary to adjust a value of the current flowing through the diagnosis resistor unit, thereby reducing the number of resistors used in the diagnosis resistor unit.

BRIEF DESCRIPTION OF DRAWINGS

FIG. 4 is a flowchart illustrating a series of processes of diagnosing an anomaly of a relay using the relay abnormality diagnosis system 100 according to an embodiment of the present invention.

DETAILED DESCRIPTION

Hereinafter, a preferred embodiment of the present invention will be described in order to facilitate understanding of the present invention. However, the following embodiment is provided only for the purpose of easier understanding of the present invention, and the present invention is not limited by the embodiment.

Figure 1:
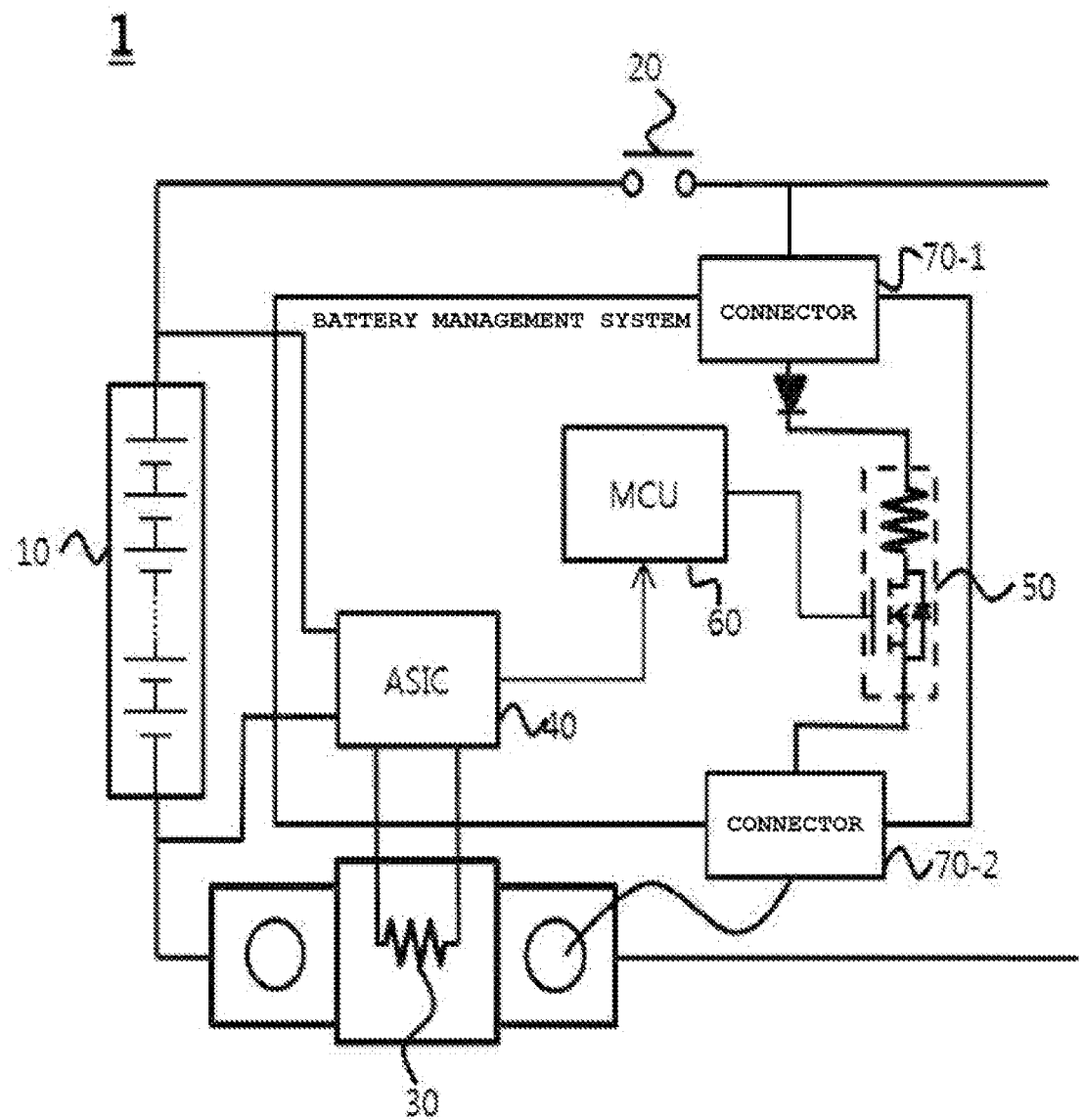
FIG. 1 is a diagram schematically illustrating a relay abnormality diagnosis system 1 of the related art.

FIG. 1 is a diagram schematically illustrating a relay abnormality diagnosis system 1 of the related art.

Referring to FIG. 1, the relay abnormality diagnosis system 1 of the related art includes a battery 10, a relay 20, a shunt resistor 30, an ASIC 40, a diagnosis resistor 50, an MCU 60, and connectors 70-1 and 70-2.

The ASIC 40 measures a current on an electric circuit including the battery 10 and the relay 20, as a current measurement element. At this time, the shunt resistor 30 may be positioned on the electric circuit, and the ASIC 40 measures a current flowing on the electric circuit by measuring a current flowing through the shunt resistor 30.

The diagnosis resistor 50 is used to diagnose an abnormality of the relay 20. For example, one side of the diagnosis resistor 50 is connected to the relay 20 and another side of the diagnosis resistor 50 is connected to the shunt resistor 30. Therefore, the diagnosis resistor 50 is connected to the battery 10 in parallel.

The MCU 60 controls each component included in the relay abnormality diagnosis system 1 of the related art and diagnoses the abnormality of the relay 20 based on the current measured by the ASIC 40.

When the abnormality of the relay 20 is to be diagnosed by using the above-described relay abnormality diagnosis system 1 of the related art, since the current flowing through the diagnosis resistor 50 is required to be measured, it was necessary to additionally include a current measurement device capable of measuring the current flowing through the diagnosis resistor 50.

When the diagnosis resistor 50 is connected to the shunt resistor 30 and the current is measured using the shunt resistor 30 and the ASIC 40, since a negative electrode side connector 70-2 and an electric circuit are required to be connected with each other by using a wire in order to provide the current flowing through the diagnosis resistor 50 to the shunt resistor 30, an additional wire is required to be installed.

In addition, when the current is measured using the shunt resistor 30 and the ASIC 40, since it is necessary to adjust a magnitude of the current flowing through the shunt resistor 30, the diagnosis resistor 50 is required to use a plurality of resistors by connecting the plurality of resistors with each other in series and in parallel.

That is, the relay abnormality diagnosis system 1 of the related art has a problem that a volume of the system is increased and a cost of the system is increased due to additional current measurement element, resistor and wire. Hereinafter, a relay abnormality diagnosis system 100 according to an embodiment of the present invention capable of solving the problems of the relay abnormality diagnosis system 1 of the related art will be described with reference to FIGS. 2 and 3.

Figure 2:
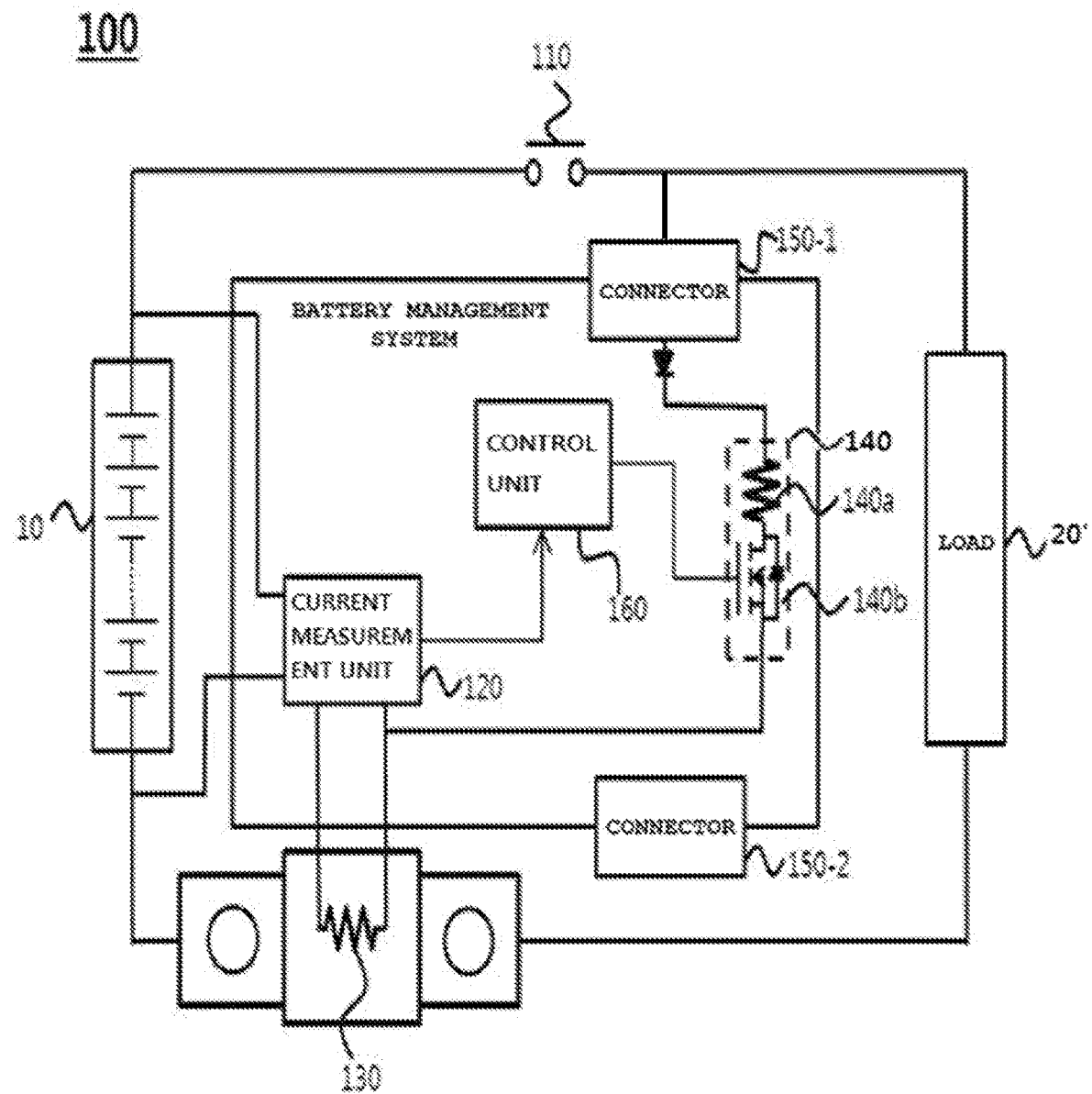
FIG. 2 is a diagram schematically illustrating a relay abnormality diagnosis system 100 according to an embodiment of the present invention.

FIG. 2 is a diagram schematically illustrating a relay abnormality diagnosis system 100 according to an embodiment of the present invention.

Referring to FIG. 2, the relay abnormality diagnosis system 100 according to an embodiment of the present invention may include a relay unit 110, a current measurement unit 120, a shunt resistor 130, a diagnosis resistor unit 140, connectors 150-1 and 150-2, and a control unit 160.

The relay abnormality diagnosis system 100 illustrated in FIG. 2 is a system according to an embodiment, and components thereof are not limited to the embodiment illustrated in FIG. 2, and can be added, changed or deleted as necessary. For example, the current measurement unit 120 and the control unit 160, which will be described later, may include a control circuit, such as a micro control unit (MCU). The MCU may simultaneously perform both a current measurement function and a control function.

First, the relay unit 110 may be a relay positioned on the electric circuit including the battery 10 and a load 20', and may provide electric power output from the battery 10 to the load 20' or perform short-circuit by controlling a conduction state on the electric circuit.

Here, although the relay unit 110 of FIG. 2 is illustrated as a relay capable of controlling the conduction state according to an input value, the present invention is not limited thereto and any component that is positioned on the electric circuit and is capable of controlling the conduction state on the electric circuit may be applied to the present invention. For example, the relay unit 110 may be a contactor, a transistor, and a thyristor.

Here, the conduction state may refer to an on state in which the electric circuit is connected without breaking to form a closed circuit and thus a current may flow on the electric circuit and an off state in which one surface side of the electric circuit is opened or shorted to form an open circuit and thus a current may not flow on the electric circuit.

In an embodiment, the relay unit 110 may be used in a form in which a plurality of relays are connected with each other based on a magnitude of the current flowing on the electric circuit and a magnitude of a voltage applied to the load.

In an embodiment, the relay unit 110 may be positioned between a positive terminal of the battery 10 and the load 20' positioned on the electric circuit.

The current measurement unit 120 may be a current measurement circuit, such as the MCU described above, that is capable of measuring the current flowing on the electric circuit including the battery 10 and the load 20'. For example, the shunt resistor 130 may be positioned on the electric circuit including the battery 10 and the load 20', and the current measurement unit 120 may be a current measurement circuit capable of measuring the current flowing on the electric circuit by measuring the current flowing on the shunt resistor 130 using the shunt resistor 130.

For example, the current measurement unit 120 may include an operational amplifier. The operational amplifier may amplify a voltage value of the battery 10 applied to the shunt resistor 130 in proportion to a predetermined gain value and the current measurement unit 120 may measure the current flowing on the electric circuit including the battery 10 and the load 20' by calculating the current using the amplified voltage value, a resistance value of the shunt resistor 130.

In an embodiment, the shunt resistor 130 may be installed on a bus bar for connecting the battery 10 and the load with each other as illustrated in FIG. 2 and may be positioned between a negative terminal of the battery 10 and the load 20'.

The diagnosis resistor unit 140 may be used to diagnose the abnormality of the relay unit 110 and connect or disconnect the relay unit 110 to or from the current measurement unit 120. To this end, the diagnosis resistor unit 140 may include one or more diagnosis resistors 140a and a switch unit 140b.

One side of the one or more diagnosis resistors 140a may be connected to the relay unit 110 through a positive electrode connector 150-1 and the other side of the one or more diagnosis resistors 140a may be connected to the switch unit 140b that will be described later.

In addition, the one or more diagnosis resistors 140a may be connected to the battery 10 in parallel and may have a predetermined resistance value to output a current of a predetermined magnitude by receiving a voltage from the battery 10. For example, the diagnosis resistors 140a may be in a form in which one or more resistors are connected with each other in series or in parallel.

The switch unit 140b may change the conduction state between the relay unit 110 and the current measurement unit 120. For example, the switch unit 140b may be a metal oxide semiconductor field effect transistor (MOSFET) as illustrated in FIG. 2, and when a control signal output from the control unit 160 that will be described later is input to a gate terminal, the switch unit 140b becomes an on state, and thus the relay unit 110 and the current measurement unit 120 may be connected with each other.

One side of the switch unit 140b may be connected to the one or more diagnosis resistors 140a and the other side of the switch unit 140b may be directly connected to the current measurement unit 120 rather than being connected to the shunt resistor 130 through the negative electrode connector 150-2.

In an embodiment, the current measurement unit 120, the diagnosis resistor unit 140, and the control unit 160 that will be described later may be positioned on one printed circuit board (PCB) and may be interconnected through a circuit pattern. For example, the switch unit 140b may be connected to the current measurement unit 120 in the circuit pattern on the PCB. Therefore, since the relay abnormality diagnosis system 100 according to an embodiment of the present invention does not connect the diagnosis resistor unit 140 and the shunt resistor 130 with each other through a wire, and simply connects the current measurement unit and the diagnosis resistor unit 140 with each other through the circuit pattern, it is not necessary to use a wire. Thus, there is an advantage that a volume and a manufacturing cost of the system may be reduced.

The control unit 160 may connect the relay unit 110 and the current measurement unit 120 with each other by controlling the diagnosis resistor unit 140. For example, when it is desired to diagnose the abnormality of the relay unit 110, the control unit 160 may output a control signal for controlling the conduction state of the switch unit 140b, and the switch unit 140b may connect the relay unit 110 and the current measurement unit 120 with each other by changing the conduction state to the on state according to the control signal.

In an embodiment, the control unit 160 may diagnose the abnormality of the relay unit 110 based on the current input to the current measurement unit 120 from the diagnosis resistor unit 140 and the current flowing on the electric circuit measured by the current measurement unit 120.

When the control unit 160 intends to diagnose the abnormality of the relay unit 110, the control unit 160 may calculate a difference value between the current flowing on the electric circuit measured by the current measurement unit 120 and the current input to the current measurement unit 120 from the diagnosis resistor unit 140, and may diagnose the abnormality of the relay unit 110 based on the calculated difference value between the currents. Hereinafter, the present invention will be described in more detail with reference to FIG. 3.

Figure 3:
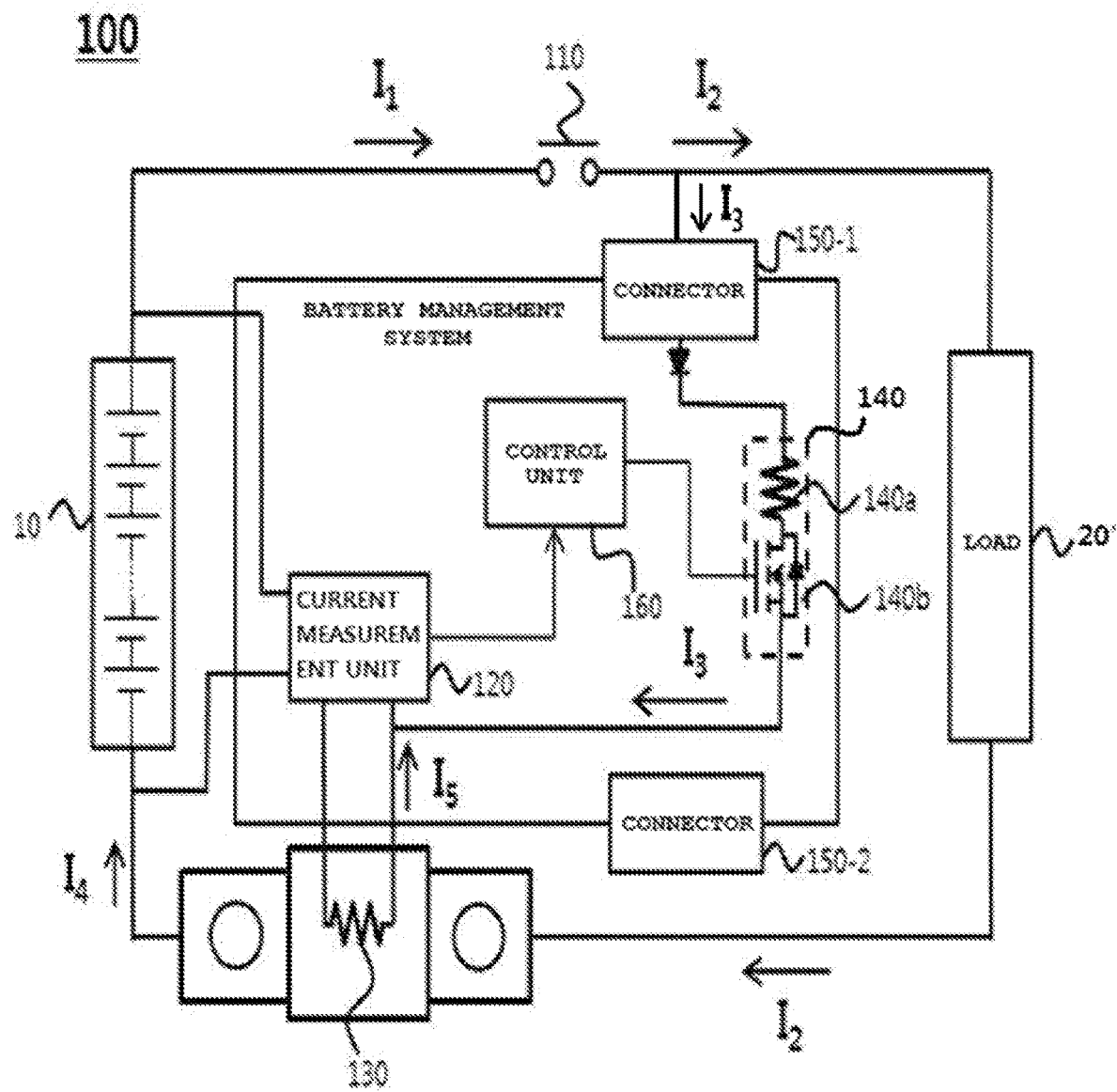
FIG. 3 is a diagram schematically illustrating a flow of a current output from a battery 10 in the relay abnormality diagnosis system 100 according to an embodiment of the present invention.

FIG. 3 is a diagram schematically illustrating a flow of the current output from the battery 10 in the relay abnormality diagnosis system 100 according to an embodiment of the present invention.

Referring to FIG. 3, the current I1 output from the battery 10 is divided into a current I2 flowing toward the load 20' and a current I3 flowing toward a positive electrode connector 150-1 while passing through the relay unit 110. At this time, the current I1 output from the battery 10 may be divided inversely proportional to a resistance value of the load 20' and a resistance value of the diagnosis resistor 140a. Thereafter, the current I2 flowing toward the load 20' is divided into a current I4 flowing toward the negative terminal of the battery 10 and a current I5 flowing through the shunt resistor 130 while passing through the shunt resistor 130, and the current measurement unit 120 measures the current I5 flowing through the shunt resistor 130. At this time, since the current measurement unit 120 receives the current I3 flowing from the diagnosis resistor unit 140 to the positive electrode connector 150-1, the current measurement unit 120 actually measures a current value obtained by summing the current I3 flowing toward the positive electrode connector 150-1 and the current I5 flowing through the shunt resistor 130.

The control unit 160 may calculate the difference value I5 between the current I3 flowing on the electric circuit from the currents (I3+I5) measured by the current measurement unit 120 and may diagnose the abnormality of the relay unit 110 based on the calculated difference value I5 between the currents.

In an embodiment, the relay abnormality diagnosis system 100 according to an embodiment of the present invention may experimentally measure the current value flowing through the diagnosis resistor 140a under one or more conditions among the resistance value of the diagnosis resistance value 140a, a type of the relay unit 110, a type of failure occurring in the relay unit 110, and the voltage value and the current value of the battery 10, and may include a storage unit (not illustrated) capable of storing the measured current value in a data table.

In an embodiment, the control unit 160 may calculate the difference value between the current flowing on the electric circuit and the current input to the current measurement unit 120 from the diagnosis resistor unit 140, and may diagnose the abnormality of the relay unit 110 by comparing the calculated current with the current value stored in the storage unit.

In another embodiment, the storage unit (not illustrated) may store the current value measured by the current measurement unit 120. The control unit 160 may analyze tendency and a pattern of the stored current value to detect an abnormal symptom, and when the abnormal symptom is detected, the control unit 160 may diagnose that the abnormality has occurred in the relay unit 110. Hereinafter, with reference to FIG. 4, a method of diagnosing the abnormality of the relay unit using the relay unit abnormality diagnosis system 100 according to an embodiment of the present invention will be described.

FIG. 4 is a flowchart illustrating a series of processes of diagnosing the anomaly of the relay using the relay abnormality diagnosis system 100 according to an embodiment of the present invention.

Referring to FIG. 4, first, a relay unit abnormality diagnosis request is received (S110).

Here, the relay unit abnormality diagnosis request may be a signal input from an outside so as to diagnose the abnormality of the relay unit. However, the present invention is not limited thereto, and the relay abnormality diagnosis system may repeatedly perform the relay unit abnormality diagnosis operation at a predetermined time interval even though an additional abnormality diagnosis request signal and instruction are not input.

In step S110, when the relay unit abnormality diagnosis request is received, the control unit controls the diagnosis resistor unit to connect the relay unit and the current measurement unit with each other (S120) and measures the current using the shunt resistor in the current measurement unit (S130).

Thereafter, the control unit calculates the difference value between the current flowing on the electric circuit and the current input to the current measurement unit from the diagnosis resistor unit based on the current measured in steps S120 and S130 (S140), and diagnoses the abnormality of the relay unit based on the calculated difference value between the currents (S150).

When the abnormality of the relay unit is not diagnosed in step S150, the process may return to step S110 and steps S110 to S150 may be repeatedly performed.

The above-described relay abnormality diagnosis method has been described with reference to the flowcharts illustrated in the drawings. While the above-described method has been illustrated and described as a series of blocks for purposes of simplicity, the present invention is not limited to the sequence of the above-described blocks, some blocks may occur in different sequences or simultaneously with other blocks as illustrated and described in the present specification, and various other branches, flow paths, and sequences of blocks that achieve the same or similar results may be implemented. In addition, not all illustrated blocks may be required for the implementation of the method described in the present specification.

While the description has been given with reference to the preferred embodiment of the present invention, it will be understood by those of ordinary skill in the art that the present invention may be variously changed and modified in a range without departing from the spirit and scope of the present invention described in the following claims.

The invention claimed is:

1. A relay abnormality diagnosis system configured to diagnose an abnormality of a relay positioned on an electric circuit between a battery and a load, the relay abnormality diagnosis system comprising:
   a connector having a first end configured to electrically connect a current path parallel to the load at a point between the relay and the load and a second end connected to the current path;
   a current measurement circuit configured to measure each of (i) a current flowing on the electric circuit between the battery and the relay and (ii) a current flowing on the current path;
   a resistor positioned on the current path;
   a switch positioned on the current path and configured to switchably connect or disconnect the relay and the current measurement circuit; and
   a control circuit configured to:
      control a connection between the relay and the current measurement circuit via the switch, and
      diagnose an abnormality of the relay based on a current input to the current measurement circuit over the current path and a measured current flowing on the electric circuit.

2. The relay abnormality diagnosis system of claim 1, wherein the switch is configured to change a conduction state between the relay and the current measurement circuit.

3. The relay abnormality diagnosis system of claim 2, wherein, to diagnose the abnormality of the relay, the control circuit is configured to output a control signal for controlling the conduction state of the switch.

4. The relay abnormality diagnosis system of claim 1, wherein the current measurement circuit is configured to measure the current flowing on the electric circuit by using a shunt resistor positioned on the electric circuit.

5. The relay abnormality diagnosis system of claim 4, wherein the relay is positioned between a positive terminal of the battery that is positioned on the electric circuit and the load, and the shunt resistor is positioned between a negative terminal of the battery and the load.

6. The relay abnormality diagnosis system of claim 1, wherein, to diagnose the abnormality of the relay, the control circuit is configured to:
   calculate a difference value between the measured current flowing on the electric circuit and the current input to the current measurement circuit from the resistor; and
   diagnose the abnormality of the relay based on the calculated difference value.

7. The relay abnormality diagnosis system of claim 1, wherein the current measurement circuit, the resistor, and the control circuit are positioned on a printed circuit board (PCB), and are interconnected through a circuit pattern.

8. A relay abnormality diagnosis method comprising:
   measuring, by a current measurement circuit, each of (i) a current flowing on an electric circuit between a battery and a relay positioned between the battery and a load, and (ii) a current flowing on a current path connected to the electric circuit parallel to the load through a connector, the current path having a resistor and a switch positioned thereon;
   switchably controlling, by a control circuit, a connection between a relay positioned on the electric circuit and the current measurement circuit, via the switch; and
   diagnosing, by the control circuit, an abnormality of the relay based on a current input to the current measurement circuit over the current path and a measured current flowing on the electric circuit.

9. The relay abnormality diagnosis method of claim 8, wherein the switch is configured to change a conduction state between the relay and the current measurement circuit, and wherein switchably controlling the connection between the relay and the current measurement circuit comprises controlling the switch.

10. The relay abnormality diagnosis method of claim 9, wherein diagnosing the abnormality of the relay comprises outputting, by the control circuit, a control signal for controlling the conduction state of the switch.

11. The relay abnormality diagnosis method of claim 8, wherein measuring the current flowing on the electric circuit is performed using a shunt resistor positioned on the electric circuit.

12. The relay abnormality diagnosis method of claim 11, wherein the relay is positioned between a positive terminal of a battery that is positioned on the electric circuit and a load, and wherein the shunt resistor is positioned between a negative terminal of the battery and the load.

13. The relay abnormality diagnosis method of claim 8, wherein diagnosing the abnormality of the relay comprises:
   calculating a difference value between the measured current flowing on the electric circuit and the current input to the current measurement circuit from the resistor; and
   diagnosing the abnormality of the relay based on the calculated difference value.

14. The relay abnormality diagnosis method of claim 8, wherein the current measurement circuit, the resistor, and the control circuit are positioned on one printed circuit board (PCB), and are interconnected through a circuit pattern.

* * * * *